(12) United States Patent
Wang

(10) Patent No.: US 11,477,400 B2
(45) Date of Patent: *Oct. 18, 2022

(54) METHOD FOR DETERMINING IMAGING RATIO OF FLEXIBLE PANEL ELECTRONIC DEVICE AND STORAGE MEDIUM

(71) Applicant: Shanghai Harvest Intelligence Technology Co., Ltd., Shanghai (CN)

(72) Inventor: Tianyang Wang, Shanghai (CN)

(73) Assignee: Shanghai Harvest Intelligence Technology Co., Ltd., Shanghai (CN)

( * ) Notice: Subject to any disclaimer, the term of this patent is extended or adjusted under 35 U.S.C. 154(b) by 287 days.

This patent is subject to a terminal disclaimer.

(21) Appl. No.: 16/821,257

(22) Filed: Mar. 17, 2020

(65) Prior Publication Data

US 2020/0304734 A1 Sep. 24, 2020

(30) Foreign Application Priority Data

Mar. 19, 2019 (CN) .......................... 201910208382.X

(51) Int. Cl.
*H04N 5/343* (2011.01)
*H04N 5/378* (2011.01)

(52) U.S. Cl.
CPC ............. *H04N 5/343* (2013.01); *H04N 5/378* (2013.01)

(58) Field of Classification Search
None
See application file for complete search history.

(56) References Cited

U.S. PATENT DOCUMENTS

| 10,514,727 | B2 * | 12/2019 | Seo | ...................... | G06F 3/04886 |
| 2015/0294438 | A1 * | 10/2015 | Kang | ............... | H04N 21/42222 |
| | | | | | 345/589 |
| 2019/0073001 | A1 * | 3/2019 | Kim | ........................ | G04G 21/08 |
| 2019/0073946 | A1 * | 3/2019 | Su | ....................... | H01L 27/3262 |

* cited by examiner

*Primary Examiner* — Peter Hoang
(74) *Attorney, Agent, or Firm* — Harness, Dickey & Pierce, P.L.C.

(57) ABSTRACT

Method for determining imaging ratio of flexible panel, electronic device and storage medium are provided. A first surface of the flexible panel is adapted to be placed with an object to be imaged, an image capturing device is disposed on the second surface, and a curvature radius of the first surface is adjustable. The method includes: for a light source in the image capturing device, acquiring a real-time image formed on the image capturing device after a light signal emitted from the light source is reflected by the first surface; determining a real-time curvature radius of the first surface based on the real-time image; and calculating the imaging ratio based on the real-time curvature radius and thickness of the flexible panel. The imaging ratio is determined based on bending degree of the flexible panel in real time to acquire an image with size approximate to actual size of the object.

14 Claims, 5 Drawing Sheets

METHOD FOR DETERMINING IMAGING RATIO OF FLEXIBLE PANEL ELECTRONIC DEVICE AND STORAGE MEDIUM

CROSS-REFERENCE TO RELATED APPLICATIONS

The present application claims priority to Chinese patent application No. 201910208382.X, filed on Mar. 19, 2019, and the entire disclosure of which is incorporated herein by reference.

TECHNICAL FIELD

The present disclosure generally relates to an image processing technology field, and more particularly, to a method for determining an imaging ratio of a flexible panel, an electronic device and a storage medium.

BACKGROUND

With the development of information technology, people are increasingly rely on electronic products for convenience and comfort they provide. In recent years, people not only pursue enrichment and perfection of functions of the electronic products, but also gradually pursue comfortable user experience brought by the electronic products.

As an emerging technology, flexible panels quickly attract a wide development on major electronic products, for example, flexible mobile phones, which are gradually changing visual sense and experience of users brought by conventional electronic products with flat panels.

For application of the flexible panels, existing image processing technology applied to the conventional flat panels needs to be changed to adapt to imaging characteristics of the flexible panels.

SUMMARY

By embodiment of the present disclosure, an imaging ratio of a flexible panel to an object to be imaged is determined to acquire an image with a size approximate to an actual size of the object to be imaged.

In an embodiment of the present disclosure, a method for determining an imaging ratio of a flexible panel is provided, wherein the flexible panel has a first surface and a second surface opposite to each other in a thickness direction, the first surface is adapted to be placed with an object to be imaged, an image capturing device is disposed on the second surface, and a curvature radius of the first surface is adjustable, wherein the method includes: for a light source in the image capturing device, acquiring a real-time image formed on the image capturing device after a light signal emitted from the light source is reflected by the first surface of the flexible panel; determining a real-time curvature radius of the first surface of the flexible panel based on the real-time image; and calculating the imaging ratio of the flexible panel to the object to be imaged based on the real-time curvature radius and a thickness of the flexible panel.

Optionally, determining the real-time curvature radius of the first surface of the flexible panel based on the real-time image includes: determining the real-time curvature radius of the first surface of the flexible panel based on a deformation of the real-time image with respect to a preset standard image.

Optionally, determining the real-time curvature radius of the first surface of the flexible panel based on the deformation of the real-time image with respect to the preset standard image includes: determining the real-time curvature radius of the first surface of the flexible panel based on ellipticity of the real-time image, wherein the real-time image is ellipse-shaped, and the preset standard image is round-shaped.

Optionally, the greater the ellipticity of the real-time image is, the smaller the real-time curvature radius of the first surface of the flexible panel is.

Optionally, the first surface of the flexible panel is adapted to be contacted with a fingerprint, and the image capturing device includes a photoelectric sensing module which is disposed on the second surface of the flexible panel, the light source is disposed close to the second surface and inside the flexible panel and configured to emit the light signal toward different directions of the first surface of the flexible panel, the light signal is reflected on the first surface of the flexible panel to form reflection light in different directions, and the reflection light passes through the flexible panel, enters and is absorbed by the photoelectric sensing module.

Optionally, the first surface of the flexible panel is a convex surface, the second surface of the flexible panel is a concave surface, and calculating the imaging ratio of the flexible panel to the object to be imaged based on the real-time curvature radius and the thickness of the flexible panel includes calculating the imaging ratio based on the following formula:

$$k=2(r-h)/r,$$

where k is the imaging ratio, r is the real-time curvature radius, h is the thickness, and k, r, and h are non-negative numbers.

Optionally, the imaging ratio k ranges from 0 to 2.

Optionally, the first surface of the flexible panel is a convex surface, the second surface of the flexible panel is a concave surface, and calculating the imaging ratio of the flexible panel to the object to be imaged based on the real-time curvature radius and the thickness of the flexible panel includes calculating the imaging ratio based on the following formula:

$$k=2r/(r-h),$$

where k is the imaging ratio, r is the real-time curvature radius, h is the thickness, and k, r, and h are non-negative numbers.

Optionally, the imaging ratio k is greater than 2.

In an embodiment of the present disclosure, an electronic device is provided, including: a flexible panel, wherein a first surface of the flexible panel in a thickness direction is adapted to be placed with an object to be imaged; an image capturing device disposed on a second surface of the flexible panel in the thickness direction, wherein the second surface is opposite to the first surface; a processor coupled with the flexible panel and the image capturing device; and a memory having a computer program stored therein, wherein when the computer program is executed by the processor, the above method is performed.

Optionally, the flexible panel includes: a flexible protection layer, having a first surface adapted to be contacted with the object to be imaged; and a display panel, with a first surface configured with the flexible protection layer thereon and a second surface configured with a photoelectric sensing module thereon, wherein a plurality of display pixels are disposed close to the second surface of the display panel and inside the display panel, and the light source includes one or more display pixels.

Optionally, the display panel and the image capturing device are bonded to each other through an optical adhesive.

Optionally, the optical adhesive includes a convertible adhesive.

In an embodiment of the present disclosure, a storage medium having a computer program stored therein is provided, wherein when the computer program is executed by a processor, the above method is performed.

Compared with existing techniques, embodiments of the present disclosure have following advantages.

Embodiments of the present disclosure provide a method for determining an imaging ratio of a flexible panel. The flexible panel has a first surface and a second surface opposite to each other in a thickness direction, the first surface is adapted to be placed with an object to be imaged, an image capturing device is disposed on the second surface, and a curvature radius of the first surface is adjustable. The method includes: for a light source in the image capturing device, acquiring a real-time image formed on the image capturing device after a light signal emitted from the light source is reflected by the first surface of the flexible panel; determining a real-time curvature radius of the first surface of the flexible panel based on the real-time image; and calculating the imaging ratio of the flexible panel to the object to be imaged based on the real-time curvature radius and a thickness of the flexible panel. By embodiments of the present disclosure, the imaging ratio of the flexible panel to the object to be imaged is determined based on a bending degree of the flexible panel in real time, so as to correct imaging distortion caused by a light path change inside the bent panel, thereby acquiring an image with a size approximate to an actual size of the object to be imaged. Specifically, imaging of the flexible panel may be performed based on principles of total reflection of physical optics. Based on the bending degree of the flexible panel, an appropriate imaging ratio is determined, and thus the real-time image formed on the image capturing device is corrected, so as to acquire an image with a size approximate to an actual size of the object to be imaged.

Further, embodiments of the present disclosure further provide an electronic device, including: a flexible panel, wherein a first surface of the flexible panel in a thickness direction is adapted to be placed with an object to be imaged; an image capturing device disposed on a second surface of the flexible panel in the thickness direction, wherein the second surface is opposite to the first surface; a processor coupled with the flexible panel and the image capturing device; and a memory having a computer program stored therein, wherein when the computer program is executed by the processor, the above method is performed. Wearing comfort of users may be improved with the flexible panel, and during a using process, an appropriate imaging ratio may be determined in real time based on the bending degree of the flexible panel of the electronic device to improve imaging accuracy of the object to be imaged (such as a finger) and to reduce distortion. In a scenario of fingerprint recognition under an optical panel, the electronic device provided in embodiments of the present disclosure may provide high fingerprint recognition accuracy regardless of the bending degree of the flexible panel.

DETAILED DESCRIPTION

As described in the background, most existing image processing technologies for optical panels have been developed based on flat panels. However, for a flexible panel, a light path inside the flexible panel may be distorted due to bending of the panel, resulting in deformation and scaling in an acquired image of an object to be imaged with respect to the object to be imaged. Therefore, if an existing image capturing device is applied to the flexible panel, a captured image may be distorted with respect to an actual image of the object to be imaged. In a scenario of fingerprint recognition under an optical panel, such distortion may seriously affect accuracy of fingerprint recognition.

Embodiments of the present disclosure provide a method for determining an imaging ratio of a flexible panel. The flexible panel has a first surface and a second surface opposite to each other in a thickness direction, the first surface is adapted to be placed with an object to be imaged, an image capturing device is disposed on the second surface, and a curvature radius of the first surface is adjustable. The method includes: for a light source in the image capturing device, acquiring a real-time image formed on the image capturing device after a light signal emitted from the light source is reflected by the first surface of the flexible panel; determining a real-time curvature radius of the first surface of the flexible panel based on the real-time image; and calculating the imaging ratio of the flexible panel to the object to be imaged based on the real-time curvature radius and a thickness of the flexible panel.

By embodiments of the present disclosure, the imaging ratio of the flexible panel to the object to be imaged is determined based on a bending degree of the flexible panel in real time, so as to correct imaging distortion caused by a light path change inside the bent panel, thereby acquiring an image with a size approximate to an actual size of the object to be imaged. Specifically, imaging of the flexible panel may be performed based on principles of total reflection of physical optics. Based on the bending degree of the flexible panel, an appropriate imaging ratio is determined, and thus the real-time image formed on the image capturing device is corrected, so as to acquire an image with a size approximate to an actual size of the object to be imaged.

In order to clarify the object, solutions and advantages of embodiments of the present disclosure, embodiments of present disclosure will be described explicitly in detail in conjunction with accompanying drawings.

Figure 1:
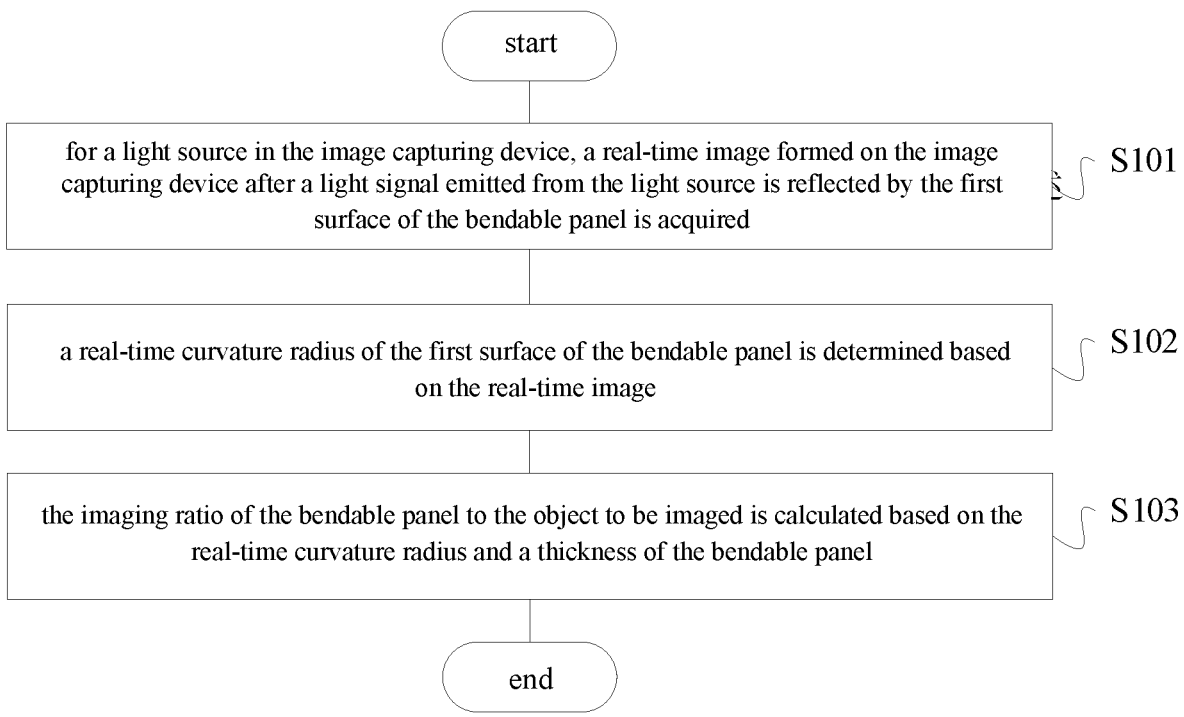
FIG. 1 schematically illustrates a flow diagram of a method for determining an imaging ratio of a flexible panel according to an embodiment.

FIG. 1 schematically illustrates a flow diagram of a method for determining an imaging ratio of a flexible panel according to an embodiment. The method provided in the embodiment may be applied to a scenario of image processing under an optical panel. For example, the method may be performed by an electronic device configured with a flexible panel to acquire an image of an object to be imaged that contacts with the flexible panel. The object to be imaged may be a finger, and the image may be a fingerprint image.

In some embodiments, the flexible panel has a first surface and a second surface opposite to each other in a thickness direction, the first surface is adapted to be placed with an object to be imaged, an image capturing device is disposed on the second surface, and a curvature radius of the first surface is adjustable.

In some embodiments, the first surface may be a side of the electronic device which faces users. When a finger of a user is in contact with the first surface, the image capturing device on the second surface may capture a fingerprint image of the finger.

In some embodiments, the image capturing device includes a photoelectric sensing module. Imaging of the flexible panel may be performed based on principles of total reflection of physical optics. An image formed by the total reflection of the flexible panel is captured by the photoelectric sensing module.

Referring to FIG. 1, the method provided in the embodiment may include S101, S102 and S103.

In S101, for a light source in the image capturing device, a real-time image formed on the image capturing device after a light signal emitted from the light source is reflected by the first surface of the flexible panel is acquired.

In S102, a real-time curvature radius of the first surface of the flexible panel is determined based on the real-time image.

In S103, the imaging ratio of the flexible panel to the object to be imaged is calculated based on the real-time curvature radius and a thickness of the flexible panel.

In some embodiments, the light source may be integrated in the image capturing device. For example, for the image capturing device disposed on the second surface of the flexible panel, the light source may be disposed between the photoelectric sensing module and the second surface of the flexible panel.

In some embodiments, the light source may be separated from the image capturing device. For example, the photoelectric sensing module is disposed on the second surface of the flexible panel, and the light source is disposed close to the second surface and inside the flexible panel. The light source is configured to emit a light signal toward different directions of the first surface of the flexible panel, the light signal is reflected on the first surface of the flexible panel to form reflection light in different directions, and the reflection light passes through the flexible panel, enters and is absorbed by the photoelectric sensing module.

In some embodiments, imaging of the flexible panel may be performed based on principles of total reflection of physical optics. In some embodiments, if the flexible panel is applied to fingerprint recognition under an optical panel, the first surface of the flexible panel is adapted to be contacted with a fingerprint, and the second surface of the flexible panel is configured with the photoelectric sensing module of the image capturing device. The light source is disposed close to the second surface and inside the flexible panel, and configured to emit the light signal toward different directions of the first surface of the flexible panel. The light signal is totally reflected on the first surface of the flexible panel to form total reflection light in different directions, and the total reflection light passes through the flexible panel, enters and is absorbed by the photoelectric sensing module. As intensity of the total reflection light is modulated by topography of a fingerprint, an image of the fingerprint can be acquired by collecting the total reflection light out of the second surface of the flexible panel.

Figure 2:
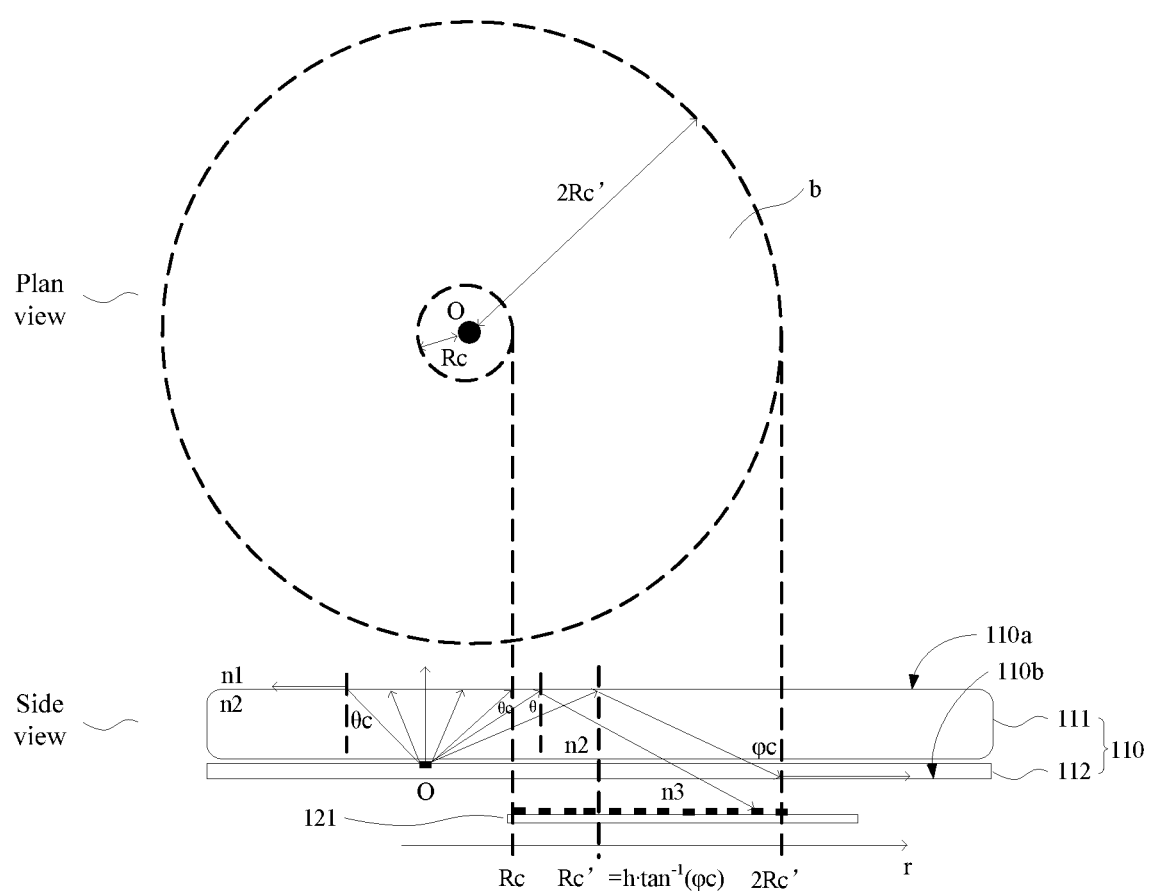
FIG. 2 schematically illustrates a diagram of an imaging optical path of light emitted from a light resource and reflected by a flexible panel according to an embodiment.

In some embodiments, referring to FIG. 2, when a bending angle of the flexible panel 110 is zero (in the case, the flexible panel 110 is equivalent to a flat panel), the light emitted from the light source O irradiates the fingerprint on the first surface 110a of the flexible panel 110, and afterward the light is received by the photoelectric sensing module 121 disposed on the second surface 110b of the flexible panel 110, where a preset standard image b corresponding to the light received by the photoelectric sensing module 121 in a plan view is shown in FIG. 2. Specifically, the preset standard image b is a dotted concentric annular belt-shaped light beam region with the light source O as an origin and a range of Rc to 2Rc' as a radius.

Rc is a projection length of light with a critical angle of total reflection $\theta c$ ($\theta c = \sin^{-1}(n1/n2)$) to a circular coordinate r axis. The light emitted from the light source O and irradiated on the first surface 110a with an incidence angle $\theta$ greater than the critical angle of total reflection $\theta c$ may be totally reflected. n1 is a refractive index of air, and n2 is a refractive index of the flexible panel 110.

2Rc' is a projection length of light with a critical angle of total reflection $\varphi c$ ($\varphi c = \sin^{-1}(n3/n2)$) to the circular coordinate r axis. The light emitted from the light source O, totally reflected on the first surface 110a and irradiated on an optical adhesive (not shown) with an incidence angle $\varphi$ greater than the critical angle of total reflection $\varphi c$ may be totally reflected for a second time. n3 is a refractive index of the optical adhesive. The optical adhesive is disposed between the light source O and the photoelectric sensing module 121, that is, the optical adhesive may be used to adhere the photoelectric sensing module 121 to the second surface 110b of the flexible panel 110.

In other words, the preset standard image b formed by the light source O on the flexible panel 110 which is actually a flat panel in a particular time is ring-shaped. When a ring width (2Rc'−Rc) of the ring is sufficiently small, the preset standard image b of the light source O on the flat panel may be round-shaped.

Figure 3:
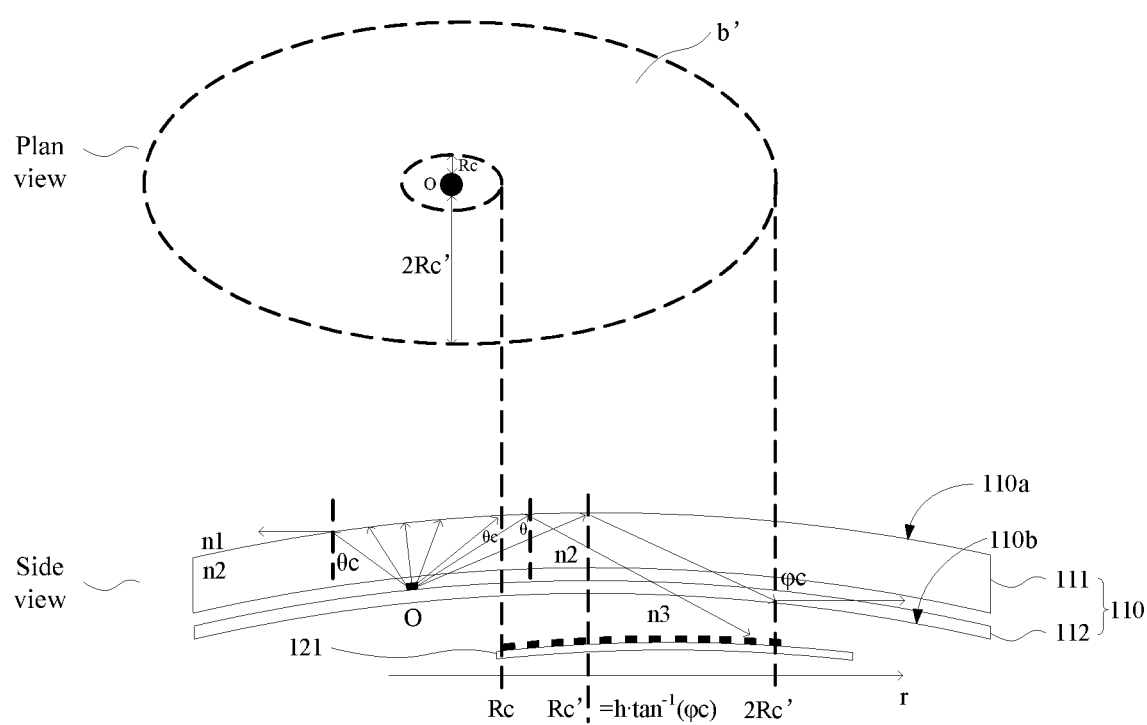
FIG. 3 schematically illustrates a diagram of an imaging optical path of light emitted from a light resource and reflected by a flexible panel according to another embodiment.

In some embodiments, referring to FIG. 3, when the bending angle of the flexible panel 110 is not zero, the flexible panel 110 and the photoelectric sensing module 121 are both bent, which causes the light emitted from the light source O changes on the light path inside the flexible panel as shown in FIG. 3 which is different from the light path as shown in FIG. 2. In this case, the real-time image b' formed by the light source O on the flexible panel 110 which is actually a curved panel may be ellipse-shaped.

In some embodiments, as the bending angle of the flexible panel 110 changes, a shape of the real-time image b' formed by the light source O on the flexible panel 110 also changes.

Figure 4:
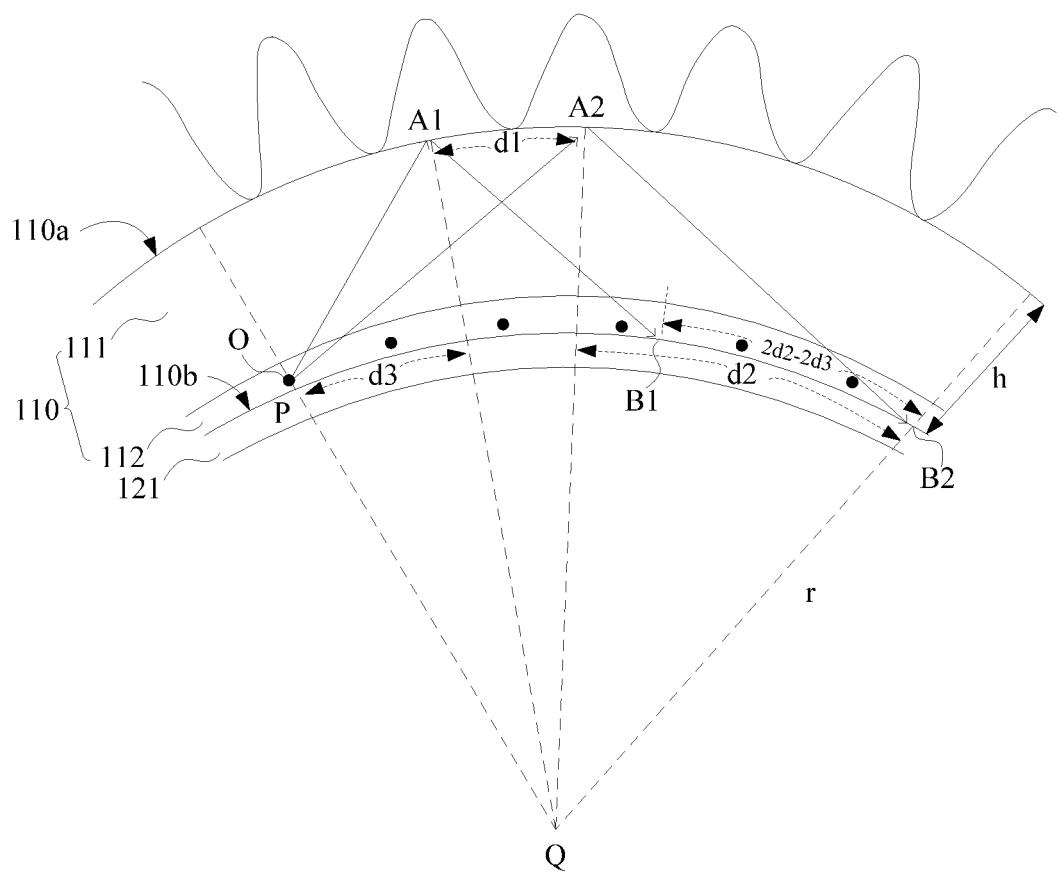
FIG. 4 schematically illustrates a diagram of an imaging optical path of a flexible panel according to an embodiment.

For example, when the flexible panel 110 is bent downward as shown in FIGS. 3 and 4, a short axis of an inner ellipse-shaped boundary of the formed real-time image b' is constant as Rc, a short axis of an outer ellipse-shaped boundary of the formed real-time image b' is constant as 2Rc', and long axes of the two ellipse-shaped boundaries change with the bending degree of the flexible panel 110. The greater the downward bending degree of the flexible panel 110 is, the longer the long axes are.

Figure 5:
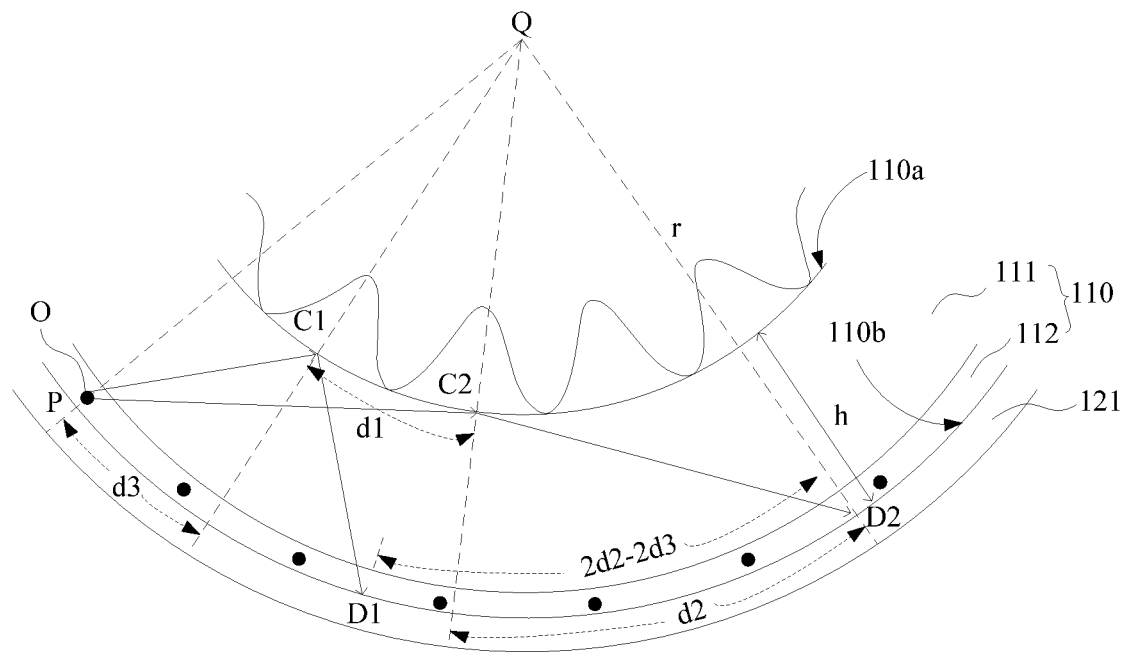
FIG. 5 schematically illustrates a diagram of an imaging optical path of a flexible panel according to another embodiment.

As another example, when the flexible panel 110 is bent upward as shown in FIG. 5, the formed real-time image may be equivalent to an effect of rotating the real-time image b' shown in FIG. 3 by 90°. In this case, a long axis of an inner ellipse-shaped boundary of the real-time image is constant as Rc, and a long axis of an outer ellipse-shaped boundary of the real-time image is constant as 2Rc', and short axes of the two ellipse-shaped boundaries change with the bending degree of the flexible panel 110. The greater the upward bending degree of the flexible panel 110 is, the longer the short axes are.

In other words, for the light emitted from the same light source, a dark region (that is, a region inside a circle with a radius of Rc) of an image acquired by reflection on a flat panel is round-shaped, and a dark region of an image acquired by reflection on a curved panel is ellipse-shaped, where ovality of the ellipse changes with the bending degree of the flexible panel.

In some embodiments, S102 may further include: determining a bending degree of the flexible panel 110 (i.e., the real-time curvature radius of the first surface 110a of the flexible panel 110) in real time based on a deformation of the real-time image b' with respect to the preset standard image b. Further, the imaging ratio of the flexible panel 110 to the object to be imaged is calculated based on the real-time curvature radius of the first surface 110a of the flexible panel 110.

For example, the real-time curvature radius of the first surface 110a of the flexible panel 110 may be determined based on ellipticity of the real-time image b'.

The ellipticity may be an abbreviation of eccentricity of the ellipse, which is a ratio of a distance between any moving point on the ellipse and a focal point of the ellipse to a distance between the moving point and an alignment of the ellipse.

In some embodiments, the greater the ellipticity of the real-time image b' is, the smaller the real-time curvature radius of the first surface 110a of the flexible panel 100 is.

In some embodiments, the bending degree of the flexible panel may be represented based on the real-time curvature radius of the first surface of the flexible panel.

In some embodiments, points on the flexible panel have similar thickness and curvature radius. Accordingly, in S101, the real-time curvature radius may be determined based on a real-time image of any light source. Further, the thickness of the corresponding region may be determined.

In some embodiments, points on the flexible panel have different thickness and curvature radius. Accordingly, in S101, the real-time curvature radius may be determined based on real-time imaging of a light source that is closest to a region where the object to be imaged currently contacts with the flexible panel.

In some embodiments, referring to FIG. 4, the first surface 110a of the flexible panel 110 is a convex surface, and the second surface 110b of the flexible panel 110 is a concave surface. The first surface 110a is adapted to be contacted with a fingerprint, the second surface 110b is configured with a photoelectric sensing module 121 thereon, and the light source O is disposed close to the second surface 110b and inside the flexible panel 110.

In some embodiments, the flexible panel 110 includes: a flexible protection layer 111, having a first surface adapted to be contacted with the object to be imaged; and a display panel 112, with a first surface configured with the flexible protection layer 111 thereon and a second surface configured with the photoelectric sensing module 121 thereon, wherein a plurality of display pixels are disposed close to the second surface of the display panel 112 and inside the display panel 112, and the light source O includes one or more display pixels.

In some embodiments, a thickness h of the flexible panel 110 may be a sum of thicknesses of the flexible protection layer 111 and a thicknesses of the display panel 112, and the real-time curvature radius r is determined in S101 and S102. Accordingly, S103 may include: calculating the imaging ratio based on a formula $k=2(r-h)/r$, where k is the imaging ratio, r is the real-time curvature radius, h is the thickness of the flexible panel, and k, r, and h are all non-negative numbers.

Specifically, the imaging scale k is used to represent a scaling factor of the fingerprint image captured by the photoelectric sensing module 121 with respect to the original fingerprint.

A derivation process of the formula $k=2(r-h)/r$ is as follows. As shown in FIG. 4, a light emitting point P of the light source O close to the second surface 110b of the flexible panel 110 emits light PA1 and PA2 toward different directions of the first surface 110a of the flexible panel 110. The light PA1 and PA2 respectively undergoes total reflection at an interface between two adjacent indentations and the first surface 110a, and the totally reflected light A1B1 and A2B2 exits at the second surface 110b of the flexible panel 110, enters the photoelectric sensing module 121 and is absorbed. An actual distance between the two adjacent indentations may be approximated by an arc length d1 between points A1 and A2 on the first surface 110a. A distance between the two adjacent indentations in the fingerprint image captured the photoelectric sensing module 121 may be approximated by an arc length $2(d2-d3)$ between light exit points B1 and B2 on the second surface 110b, where d3 is an arc length on the second surface 110b between a light emitting point P of the light source O and a normal line QA1 of the light emitting point P, and d2 is an arc length on the second surface 110b between the light emitting point P of the light source O and a normal line QA2 of the light emitting point P. Therefore, a ratio of the distance between the two adjacent indentations in the fingerprint image captured the photoelectric sensing module 121 to the actual distance between the two adjacent indentations (i.e., the imaging ratio of the flexible panel 110 to the fingerprint) is $k=2(d2-d3)/d1=2(r-h)/r$.

In some embodiments, the scaling factor k of the fingerprint image captured by the photoelectric sensing module 121 with respect to the original fingerprint is greater than 0 and smaller than 2. In some embodiments, the scaling factor k of the flexible panel 110 is greater than 1, and the captured image is an enlarged image of the fingerprint in this case. In some embodiments, the scaling factor k of the flexible panel 110 is smaller than 1, and the captured image is a dwindled image of the fingerprint in this case. Specifically, when $r>2h$, $1<k<2$, and when $h<r<2h$, $0<k<1$.

When the real-time curvature radius r of the flexible panel 110 approaches positive infinity, that is, when the flexible panel 110 is flat, its imaging ratio is two.

In some embodiments, referring to FIG. 5, the first surface 110a of the flexible panel 110 is a convex surface, and the second surface 110b of the flexible panel 110 is a concave surface. The first surface 110a is adapted to be contacted with a fingerprint, the second surface 110b is configured with a photoelectric sensing module 121 thereon, and the light source O is disposed close to the second surface 110b and inside the flexible panel 110.

In some embodiments, the flexible panel 110 includes: a flexible protection layer 111, having a first surface adapted to be contacted with the object to be imaged; and a display panel 112, with a first surface configured with the flexible protection layer 111 thereon and a second surface configured with the photoelectric sensing module 121 thereon, wherein a plurality of display pixels are disposed close to the second surface of the display panel 112 and inside the display panel 112, and the light source O includes one or more display pixels.

In some embodiments, a thickness h of the flexible panel 110 may be a sum of thicknesses of the flexible protection layer 111 and a thicknesses of the display panel 112, and the real-time curvature radius r is determined in S101 and S102. Accordingly, S103 may include: calculating the imaging ratio based on a formula $k=2r/(r-h)$, where k is the imaging ratio, r is the real-time curvature radius, h is the thickness of the flexible panel, and k, r, and h are all non-negative numbers.

Specifically, the imaging scale k is used to represent a scaling factor of the fingerprint image captured by the photoelectric sensing module 121 with respect to the original fingerprint.

A derivation process of the formula $k=2r/(r-h)$ is as follows. As shown in FIG. 5, a light emitting point P of the light source O close to the second surface 110b of the flexible panel 110 emits light PC1 and PC2 toward different directions of the first surface 110a of the flexible panel 110. The light PC1 and PC2 respectively undergoes total reflection at an interface between two adjacent indentations and the first surface 110a, and the totally reflected light C1D1 and C2D2 exits at the second surface 110b of the flexible panel 110, enters the photoelectric sensing module 121 and is absorbed. An actual distance between the two adjacent indentations may be approximated by an arc length d1 between points C1 and C2 on the first surface 110a. A distance between the two adjacent indentations in the fingerprint image captured the photoelectric sensing module 121 may be approximated by an arc length $2(d2-d3)$ between light exit points D1 and D2 on the second surface 110b, where d3 is an arc length on the second surface 110b between a light emitting point P of the light source O and a normal line QC1 of the light emitting point P, and d2 is an arc length on the second surface 110b between the light emitting point P of the light source O and a normal line QC2 of the light emitting point P. Therefore, a ratio of the distance between the two adjacent indentations in the fingerprint image captured the photoelectric sensing module 121 to the actual distance between the two adjacent indentations (i.e., the imaging ratio of the flexible panel 110 to the fingerprint) is $k=2(d2-d3)/d1=2r/(r-h)$.

In some embodiments, the scaling factor k of the fingerprint image captured by the photoelectric sensing module 121 with respect to the original fingerprint is greater than 2, that is, the fingerprint image captured by the photoelectric sensing module 121 is an enlarged image of the fingerprint.

When the real-time curvature radius r of the flexible panel 110 approaches positive infinity, that is, when the flexible panel 110 is flat, its imaging ratio is two.

It should be noted that, in the method for determining the imaging ratio of the flexible panel provided in embodiments as shown in FIGS. 2 to 5, a thickness of the photoelectric sensing module is neglected. In most cases, the thickness of the flexible panel is much larger than that of the photoelectric sensing module. If not being negligible, the thickness of the photoelectric sensing module needs to be considered during the determination of the imaging ratio of the flexible panel.

An embodiment of the present disclosure further provides a storage medium having a computer program stored therein. When the computer program is executed by a processor, the above-mentioned method is performed.

In some embodiments, the storage medium further stores a thickness of each point or each region on the flexible panel.

From above, by embodiments of the present disclosure, the imaging ratio of the flexible panel to the object to be imaged is determined based on a bending degree of the flexible panel in real time, so as to correct imaging distortion caused by a light path change inside the bent panel, thereby acquiring an image with a size approximate to an actual size of the object to be imaged. Specifically, imaging of the flexible panel may be performed based on principles of total reflection of physical optics. Based on the bending degree of the flexible panel, an appropriate imaging ratio is determined, and thus the real-time image formed on the image capturing device is corrected, so as to acquire an image with a size approximate to an actual size of the object to be imaged.

Figure 6:
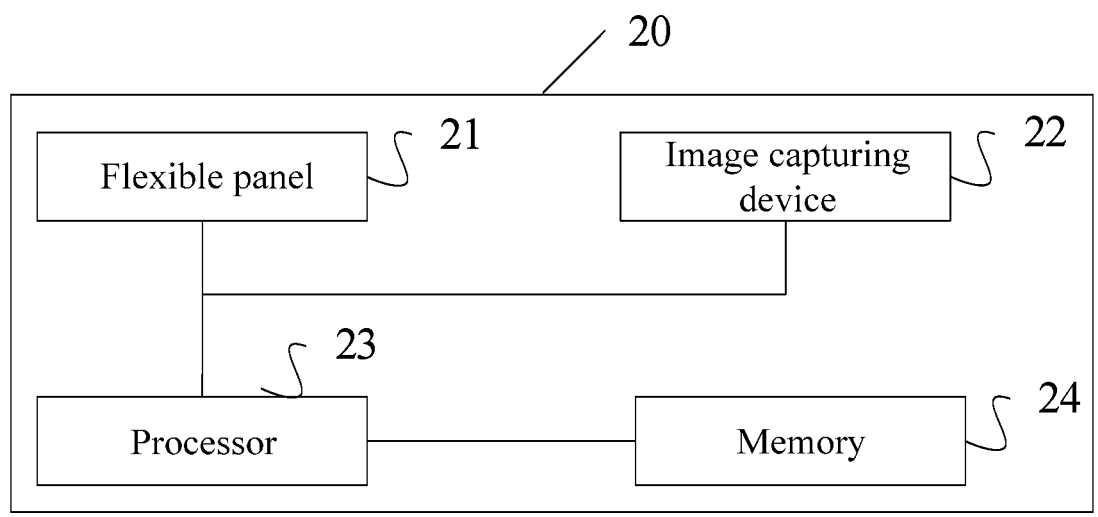
FIG. 6 schematically illustrates a block diagram of an electronic device according to an embodiment.

An embodiment of the present disclosure further provides an electronic device. Referring to FIG. 6, FIG. 6 schematically illustrates a block diagram of an electronic device according to an embodiment.

The electronic device 20 includes: a flexible panel 21, wherein a first surface of the flexible panel in a thickness direction of the flexible panel is adapted to be placed with an object to be imaged; an image capturing device 22 disposed on a second surface of the flexible panel 21 in the thickness direction, wherein the second surface is opposite to the first surface; a processor 23 coupled with the flexible panel 21 and the image capturing device 22; and a memory 24 having a computer program stored therein, wherein when the computer program is executed by the processor 23, the above method as shown in FIGS. 1 to 5 is performed.

Referring to FIGS. 2 to 5, in some embodiments, the electronic device 20 possesses a function of fingerprint recognition under an optical panel. The flexible panel 21 (corresponding to the flexible panel 110 as shown in FIGS. 2 to 5) includes: a flexible protection layer 111, having a first surface adapted to be contacted with the object to be imaged; and a display panel 112, with a first surface configured with the flexible protection layer 111 thereon and a second surface configured with a photoelectric sensing module 121 thereon, wherein a plurality of display pixels are disposed close to the second surface of the display panel 112 and inside the display panel 112, and the light source O includes one or more display pixels.

In some embodiments, the image capturing device 22 may be the photoelectric sensing module 121.

In some embodiments, imaging of the flexible panel 21 may be performed based on principles of total reflection of physical optics. Structures and functions of the flexible protection layer, the display panel and the photoelectric sensing module can be referred to the above descriptions of FIGS. 2 to 5, and are not described in detail here.

In some embodiments, when the computer program stored in the memory 24 is executed by the processor 23 to perform the method for determining the imaging ratio of the flexible panel as shown in FIGS. 1 to 5, the real-time curvature radius of the flexible panel 21 and a region pressed by the fingerprint on the first surface of the flexible panel 21 may be determined first, then a thickness of the flexible panel 21 at the pressed region is determined, and further the imaging ratio is calculated based on the real-time curvature radius and the thickness.

In some embodiments, after the computer program is executed by the processor, the image captured by the image capturing device 22 is corrected based on the determined imaging ratio of the flexible panel 21, so as to acquire an image with a size approximate to an actual size of the object to be imaged.

In some embodiments, the electronic device 20 may be made of a flexible material to be flexible. For example, the image capturing device 22 may be formed on a flexible substrate in the form of a Thin Film Transistor (TFT).

Further, the flexible protection layer 111 may be made of Colorless Polyimide (CPI).

In some embodiments, the display panel 112 and the image capturing device 22 are bonded to each other through an optical adhesive. For example, the display panel 112 and the photoelectric sensing module 121 are bonded to each other through an optical adhesive.

In some embodiments, the optical adhesive includes a convertible adhesive.

In some embodiments, the electronic device 20 may include a mobile phone, a smart bracelet or a wristwatch.

From above, wearing comfort of users may be improved with the flexible panel, and during a using process, an appropriate imaging ratio may be determined in real time based on the bending degree of the flexible panel of the electronic device to improve imaging accuracy of the object to be imaged (such as a finger) and to reduce distortion. In a scenario of fingerprint recognition under an optical panel, the electronic device provided in embodiments of the present disclosure may provide high fingerprint recognition accuracy regardless of the bending degree of the flexible panel.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A method for determining an imaging ratio of a flexible panel, wherein the flexible panel has a first surface and a second surface opposite to each other in a thickness direction, the first surface is adapted to be placed with an object to be imaged, an image capturing device is disposed on the second surface, and a curvature radius of the first surface is adjustable, wherein the method comprises:
for a light source in the image capturing device, acquiring a real-time image formed on the image capturing device after a light signal emitted from the light source is reflected by the first surface of the flexible panel;
determining a real-time curvature radius of the first surface of the flexible panel based on the real-time image; and
calculating the imaging ratio of the flexible panel to the object to be imaged based on the real-time curvature radius and a thickness of the flexible panel.

2. The method according to claim 1, wherein determining the real-time curvature radius of the first surface of the flexible panel based on the real-time image comprises:
determining the real-time curvature radius of the first surface of the flexible panel based on a deformation of the real-time image with respect to a preset standard image.

3. The method according to claim 2, wherein determining the real-time curvature radius of the first surface of the flexible panel based on the deformation of the real-time image with respect to the preset standard image comprises:
determining the real-time curvature radius of the first surface of the flexible panel based on ellipticity of the real-time image, wherein the real-time image is ellipse-shaped, and the preset standard image is round-shaped.

4. The method according to claim 3, wherein the greater the ellipticity of the real-time image is, the smaller the real-time curvature radius of the first surface of the flexible panel is.

5. The method according to claim 1, wherein the first surface of the flexible panel is adapted to be contacted with a fingerprint, and the image capturing device comprises a photoelectric sensing module which is disposed on the second surface of the flexible panel, the light source is disposed close to the second surface and inside the flexible panel and configured to emit the light signal toward different directions of the first surface of the flexible panel, the light signal is reflected on the first surface of the flexible panel to form reflection light in different directions, and the reflection light passes through the flexible panel, enters and is absorbed by the photoelectric sensing module.

6. The method according to claim 5, wherein the first surface of the flexible panel is a convex surface, the second surface of the flexible panel is a concave surface, and calculating the imaging ratio of the flexible panel to the object to be imaged based on the real-time curvature radius and the thickness of the flexible panel comprises:
calculating the imaging ratio based on the following formula:

$$k=2(r-h)/r,$$

where k is the imaging ratio, r is the real-time curvature radius, h is the thickness, and k, r, and h are non-negative numbers.

7. The method according to claim 6, wherein the imaging ratio k ranges from 0 to 2.

8. The method according to claim 5, wherein the first surface of the flexible panel is a convex surface, the second surface of the flexible panel is a concave surface, and calculating the imaging ratio of the flexible panel to the object to be imaged based on the real-time curvature radius and the thickness of the flexible panel comprises:
calculating the imaging ratio based on the following formula:

$$k=2r/(r-h),$$

where k is the imaging ratio, r is the real-time curvature radius, h is the thickness, and k, r, and h are non-negative numbers.

9. The method according to claim 8, wherein the imaging ratio k is greater than 2.

10. An electronic device, comprising:
a flexible panel, wherein a first surface of the flexible panel in a thickness direction of the flexible panel is adapted to be placed with an object to be imaged;
an image capturing device disposed on a second surface of the flexible panel in the thickness direction, wherein the second surface is opposite to the first surface;
a processor coupled with the flexible panel and the image capturing device; and
a memory having a computer program stored therein, wherein when the computer program is executed by the processor, the method according to claim 1 is performed.

11. The electronic device according to claim 10, wherein the flexible panel comprises:
a flexible protection layer, having a first surface adapted to be contacted with the object to be imaged; and
a display panel, with a first surface configured with the flexible protection layer thereon and a second surface configured with a photoelectric sensing module thereon, wherein a plurality of display pixels are disposed close to the second surface of the display panel and inside the display panel, and the light source comprises one or more display pixels.

12. The electronic device according to claim 11, wherein the display panel and the image capturing device are bonded to each other through an optical adhesive.

13. The electronic device according to claim 12, wherein the optical adhesive comprises a convertible adhesive.

14. A non-transitory storage medium having a computer program stored therein, wherein when the computer program is executed by a processor, the method according to claim 1 is performed.

* * * * *